United States Patent
Niizeki et al.

(10) Patent No.: US 10,439,100 B2
(45) Date of Patent: Oct. 8, 2019

(54) METHOD OF MANUFACTURING OPTICAL SEMICONDUCTOR APPARATUS

(71) Applicant: NIKKISO CO., LTD., Tokyo (JP)

(72) Inventors: Shoichi Niizeki, Hakusan Ishikawa (JP); Hiroyasu Ichinokura, Hakusan Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/196,997

(22) Filed: Nov. 20, 2018

(65) Prior Publication Data
US 2019/0088818 A1 Mar. 21, 2019

Related U.S. Application Data

(63) Continuation of application No. PCT/JP2017/040816, filed on Nov. 13, 2017.

(30) Foreign Application Priority Data

Dec. 7, 2016 (JP) .................. 2016-237608

(51) Int. Cl.
| | |
|---|---|
| *H01L 21/00* | (2006.01) |
| *H01L 33/00* | (2010.01) |
| *H01L 33/32* | (2010.01) |
| *H01L 33/52* | (2010.01) |
| *H01L 33/64* | (2010.01) |
| *H01L 23/02* | (2006.01) |

(Continued)

(52) U.S. Cl.
CPC .......... *H01L 33/0075* (2013.01); *H01L 23/02* (2013.01); *H01L 33/32* (2013.01); *H01L 33/48* (2013.01); *H01L 33/52* (2013.01); *H01L 33/64* (2013.01); *H01S 5/022* (2013.01); *H01L 2224/16225* (2013.01); *H01L 2924/16195* (2013.01); *H01L 2933/0033* (2013.01); *H01L 2933/0075* (2013.01)

(58) Field of Classification Search
None
See application file for complete search history.

(56) References Cited

FOREIGN PATENT DOCUMENTS

| JP | H11121920 A | 4/1999 |
|---|---|---|
| JP | 2006287226 A | 10/2006 |

(Continued)

OTHER PUBLICATIONS

Written Opinion PCT/ISA/237 dated Dec. 19, 2017 in corresponding PCT Application PCT/JP2017/040816, with English translation, 9 pages.

(Continued)

*Primary Examiner* — Calvin Y Choi
(74) *Attorney, Agent, or Firm* — Muncy, Geissler, Olds & Lowe, PC

(57) ABSTRACT

A method of manufacturing an optical semiconductor apparatus includes: placing a light transmissive lid body on a package substrate adapted to house an optical semiconductor device in an atmosphere of a first gas containing oxygen ($O_2$), sandwiching a bonding member containing gold-tin (AuSn); exchanging an atmosphere gas for a second gas so as to reduce an oxygen concentration in the atmosphere while a load is exerted from above the lid body placed on the package substrate for temporary sealing; and heating and melting the bonding member after an exchange for the second gas is started so as to bond the package substrate and the lid body.

5 Claims, 3 Drawing Sheets

(51) Int. Cl.
*H01L 33/48* (2010.01)
*H01S 5/022* (2006.01)

(56) References Cited

FOREIGN PATENT DOCUMENTS

| | | |
|---|---|---|
| JP | 2007067373 A | 3/2007 |
| JP | 2013042079 A | 2/2013 |
| JP | 2014175565 A | 9/2014 |
| JP | 2014216532 A | 11/2014 |
| JP | 2014236202 A | 12/2014 |
| JP | 2015018873 A | 1/2015 |

OTHER PUBLICATIONS

Search Report PCT/ISA/210 dated Dec. 19, 2017 in corresponding PCT Application PCT/JP2017/040816, with English translation, 5 pages.

METHOD OF MANUFACTURING OPTICAL SEMICONDUCTOR APPARATUS

CROSS REFERENCE TO RELATED APPLICATIONS

This application is a Continuation of co-pending Application No. PCT/JP2017/040816, filed on Nov. 13, 2017, for which priority is claimed under 35 U.S.C. § 120; and this application claims priority of Application No. 2016-237608 filed in Japan on Dec. 7, 2016 under 35 U.S.C. § 119, the entire contents of all of which are hereby incorporated by reference.

BACKGROUND

1. Field of the Invention

The present invention relates to optical semiconductor apparatuses, and, more particularly, to an optical semiconductor apparatus including an optical semiconductor device.

2. Description of the Related Art

Nowadays, semiconductor light emitting devices such as light emitting diodes and laser diodes that emit blue light have been in practical use. Development of light emitting devices that output light having a shorter wavelength, and, more particularly, deep ultraviolet light has been pursued. Deep ultraviolet light has sterilization capability. Semiconductor light emitting devices capable of outputting deep ultraviolet light have attracted attention as a mercury-free sterilization light source in medical and food processing fronts.

A light emitting device is housed in a package to protect the device from an external environment. In the case of a nitride semiconductor capable of outputting deep ultraviolet light, it is known that degradation of the semiconductor layer is inhibited by sealing the semiconductor in an atmosphere gas containing oxygen. For example, the light emitting device is sealed in a gas containing oxygen ($O_2$) and nitrogen ($N_2$) (see, for example, patent document 1). There is also proposed a technology to seal a light emitting device for deep ultraviolet light with a high reliability by using eutectic bonding of gold-tin (AuSn).

When gold-tin is used as a sealing member, and when the atmosphere gas for a sealing step contains oxygen, the gold-sin is oxidized when the gold-tin alloy is heated and melted. As a result, reliable sealing might be prevented. Meanwhile, if the sealing gas does not contain oxygen, the optical semiconductor device is likely to be degraded and the reliability of the optical semiconductor apparatus is lowered.

SUMMARY

In this background, one illustrative purpose of the present invention is to provide a technology for increasing the reliability of an optical semiconductor apparatus.

A method of manufacturing an optical semiconductor apparatus according to an embodiment of the present invention includes: placing a light transmissive lid body on a package substrate adapted to house an optical semiconductor device in an atmosphere of a first gas containing oxygen ($O_2$), sandwiching a bonding member containing gold-tin (AuSn); exchanging an atmosphere gas for a second gas so as to reduce an oxygen concentration in the atmosphere while a load is exerted from above the lid body placed on the package substrate for temporary sealing; and heating and melting the bonding member after an exchange for the second gas is started so as to bond the package substrate and the lid body.

According to this embodiment, the sealed gas in the package can contain oxygen by placing the lid body in an atmosphere of the first gas containing oxygen. By lowering the oxygen concentration in the atmosphere while the load is exerted on the lid body for temporary sealing, oxygen is inhibited from leaking outside the package and is allowed to remain in the package, and, at the same time, the gold-tin bonding member is heated and melted in a condition of a low oxygen concentration in the atmosphere so as to form eutectic bonding suitably. Thus, according to the embodiment, the optical semiconductor device is prevented from being degraded by sealing oxygen, and, at the same time, oxidation of the gold-tin bonding member is prevented. Accordingly, a highly reliable optical semiconductor apparatus can be manufactured.

The method may further include: cooling a bonding part while maintaining the load exerted from above the lid body bonded on the package substrate in an atmosphere of a second gas.

An oxygen ($O_2$) content percentage in the first gas may be 10 volume % or higher, and an oxygen ($O_2$) content percentage in the second gas may be 0.01 volume % or lower.

The bonding member may start to be heated and melted before an oxygen concentration inside the package substrate drops to 1 volume % or lower.

The bonding member may start to be heated and melted after an oxygen concentration outside the package substrate drops to 0.1 volume % or lower.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
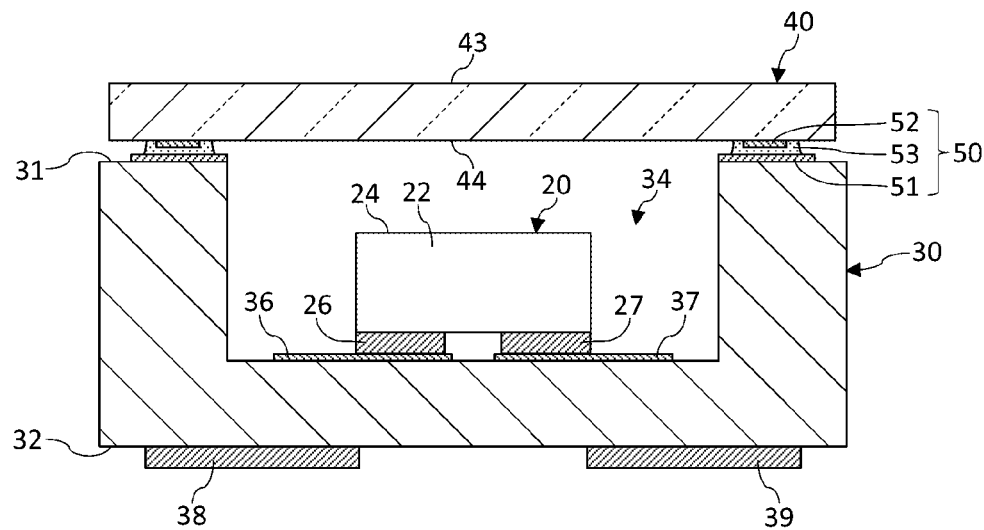
FIG. 1 is a cross sectional view schematically showing an optical semiconductor apparatus according to the embodiment.

The invention will now be described by reference to the preferred embodiments. This does not intend to limit the scope of the present invention, but to exemplify the invention.

A description will be given of an embodiment of the present invention with reference to the drawings. Like numerals are used in the description to denote like elements and duplicate descriptions are omitted as appropriate. To facilitate the understanding, the relative dimensions of the constituting elements in the drawings do not necessarily mirror the relative dimensions in the actual apparatus.

FIG. 1 is a cross sectional view schematically showing an optical semiconductor apparatus 10 according to the embodiment. The optical semiconductor apparatus 10 includes an optical semiconductor device 20, a package substrate 30, a lid body 40, and a sealing structure 50.

The optical semiconductor device 20 is a light emitting diode (LED) chip configured to emit "deep ultraviolet light" having a central wavelength λ of about 360 nm or lower. To output deep ultraviolet light having such a wavelength, the optical semiconductor device 20 is made of an aluminum gallium nitride (AlGaN) based semiconductor material having a band gap of about 3.4 eV or larger. The embodiment particularly discusses a case of emitting deep ultraviolet light having a central wavelength λ of about 240 nm-350 nm.

The optical semiconductor device 20 includes a semiconductor stack structure 22, a light emission surface 24, a first device electrode 26, and a second device electrode 27.

The semiconductor stack structure 22 includes a template layer, an n-type clad layer, an active layer, a p-type clad layer, etc. built on a substrate that embodies the light emission surface 24. When the optical semiconductor device 20 is configured to output deep ultraviolet light, a sapphire ($Al_2O_3$) substrate is used as the substrate embodying the light emission surface 24, and an aluminum nitride (AlN) layer is used as the template layer of the semiconductor stack structure 22. The clad layer and the active layer of the semiconductor stack structure 22 are made of an AlGaN-based semiconductor material.

The first device electrode 26 and the second device electrode 27 are electrodes for supplying carriers to the active layer of the semiconductor stack structure 22 and are an anode electrode and a cathode electrode, respectively. The first device electrode 26 and the second device electrode 27 are provided opposite to the light emission surface 24. The first device electrode 26 is attached to a first inner electrode 36 of the package substrate 30, and the second device electrode 27 is attached to a second inner electrode 37 of the package substrate 30.

The package substrate 30 is a rectangular member having a top surface 31 and a bottom surface 32. The package substrate 30 is a ceramic substrate that contains alumina ($Al_2O_3$), aluminum nitride (AlN), etc. and is a so-called high temperature co-fired ceramic (HTCC) multilayer substrate.

A recess 34 for housing the optical semiconductor device 20 is provided on the top surface 31 of the package substrate 30. The first inner electrode 36 and the second inner electrode 37 to which the optical semiconductor device 20 is attached are provided on the bottom surface of the recess 34. On the bottom surface 32 of the package substrate 30 are provided a first outer electrode 38 and a second outer electrode 39 for mounting the optical semiconductor apparatus 10 on, for example, an external substrate.

The lid body 40 is a plate-like protective member provided to cover the opening of the recess 34. The lid body 40 is made of a material that transmits ultraviolet light emitted by the optical semiconductor device 20. For example, glass, quartz, crystal, sapphire, etc. may be used. The lid body 40 is preferably made of a material having a high deep ultraviolet transmittance and highly heat resistant and airtight. Quartz glass is a material having such a property and is desirably used in the lid body 40. The ultraviolet light emitted by the optical semiconductor device 20 is output via the lid body 40 from an outer surface 43 of the lid body 40 to a space outside the package.

The sealing structure 50 includes a first metal layer 51, a second metal layer 52, and a metal bonding part 53.

The first metal layer 51 is provided on the top surface 31 of the package substrate 30 in a shape of a frame. The first metal layer 51 has a rectangular frame shape associated with the rectangular package substrate 30. The four corners of the first metal layer 51 may be rounded. The first metal layer 51 is formed by, for example, metalizing a ceramic substrate. The first metal layer 51 is formed by plating a base member containing tungsten (W) or molybdenum (Mo) with nickel (Ni), gold (Au), etc. and has a stack structure of W/Ni/Au. The first metal layer 51 is bonded to the metal bonding part 53.

The second metal layer 52 is provided on an inner surface 44 of the lid body 40 in a shape of a frame. The second metal layer 52 has a rectangular frame shape associated with the rectangular lid body 40. The four corners of the second metal layer 52 may be rounded. The second metal layer 52 is formed by a method such as vacuum deposition and sputtering. The second metal layer 52 is a multilayer film in which titanium (Ti), platinum (Pt), and gold (Au) are built on the inner surface 44 of the lid body 40 in the stated order. Chromium (Cr) may be used in place of titanium, and copper (Cu) and nickel (Ni) may be used in place of platinum (Pt). The second metal layer 52 is bonded to the metal bonding part 53.

The metal bonding part 53 is provided between the first metal layer 51 and the second metal layer 52 and bonds and seals the package substrate 30 and the lid body 40 at the outer circumference of the package. The metal bonding part 53 is configured to fill a space between the first metal layer 51 and the second metal layer 52. The metal bonding part 53 is made of a metal material having a low melting point and contains, for example, gold-tin (AuSn). The metal bonding part 53 spreads between the first metal layer 51 and the second metal layer 52 when melted to form eutectic bonding. It is preferable that the metal bonding part 53 is made of gold-tin containing tin (Sn) in an amount of 20 weight %-24 weight % to ensure high sealing reliability and a melting temperature of 300° C. or lower.

A gas containing oxygen ($O_2$) is sealed inside the package housing the optical semiconductor device 20. By containing oxygen in the sealed gas, degradation of the optical semiconductor device 20 is prevented, and the life of the optical semiconductor apparatus 10 is extended as compared to the case of sealing a gas that does not substantially contain oxygen. A mixture of an inert gas such as nitrogen ($N_2$) with a certain amount of oxygen may be used as the sealed gas. The oxygen concentration in the sealed gas may be 1 volume % or higher, and, preferably, 3 volume % or higher.

When a gold-tin bonding member is heated and melted to form the metal bonding part 53 and when oxygen is contained in the atmosphere, the gold-tin alloy might be inhibited from being melted due to oxidation so that the reliability of sealing might be lowered. Generally, the oxygen concentration needs to be 0.1 volume % or lower, and, preferably, 0.04 volume percent or lower to prevent oxidation of gold-tin. Meanwhile, the oxygen concentration in the sealed gas is preferably 1 volume % or higher. If the gold-tin bonding member is heated and melted in an atmosphere of such a sealed gas, gold-tin will be oxidized. This is addressed in this embodiment by performing a step of gold-tin bonding in an environment in which a certain amount of oxygen or larger is contained in the package of the optical semiconductor apparatus 10 but oxygen is not substantially contained outside the package of the optical semiconductor apparatus 10. A description will now be given of a method of manufacturing the optical semiconductor apparatus 10 for performing such a bonding step.

Figure 2:
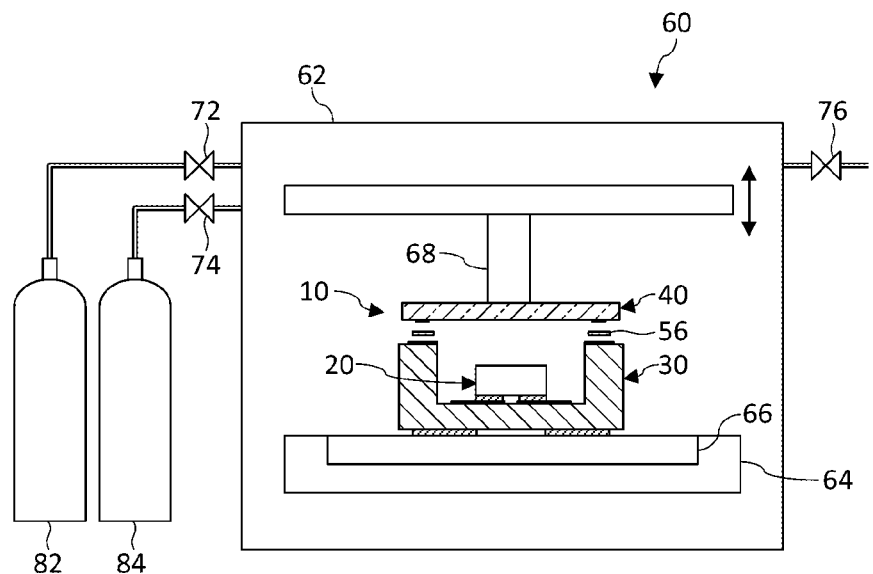
FIG. 2 schematically shows a process of manufacturing the optical semiconductor apparatus.

FIG. 2 schematically shows a process of manufacturing the optical semiconductor apparatus 10 and shows an exemplary manufacturing apparatus 60 used to seal the optical semiconductor apparatus 10. The manufacturing apparatus 60 includes a chamber 62, a table 64, a heating and cooling mechanism 66, a lid body transportation unit 68, a first gas supply port 72, a second gas supply port 74, and a gas discharge port 76.

The chamber 62 is a container in which the step of sealing the optical semiconductor apparatus 10 is performed. The chamber 62 is provided with the first gas supply port 72, the second gas supply port 74, and the gas discharge port 76. The first gas supply port 72 is connected to a first gas supply unit 82 and introduces a first gas with an oxygen concentration of 10 volume % or higher into the chamber 62. The second gas supply port 74 is connected to a second gas supply unit 84 and introduces a second gas with an oxygen concentration of 0.01 volume % or lower into the chamber 62. The gas discharge port 76 is opened when the atmosphere gas in the chamber 62 is exchanged and discharges the gas subject to exchange outside the chamber 62.

The table 64 is provided in the chamber 62, and the package substrate 30 subject to sealing is placed on the table 64. The heating and cooling mechanism 66 is provided on the table 64. The heating and cooling mechanism 66 includes a heater for heating the package substrate 30 and an air cooling mechanism or a water cooling mechanism for cooling the package substrate 30, thereby enabling heating and cooling of the package substrate 30. The heating and cooling mechanism 66 may only include a heating function, and the package substrate 30 may be cooled by natural heat dissipation.

The lid body transportation unit 68 is provided above the table 64. The lid body transportation unit 68 is configured to transport the lid body 40 above the package substrate 30 to place the lid body 40 on the package substrate 30. The lid body transportation unit 68 exerts a load on the lid body 40 placed on the package substrate 30 temporarily seal a space between the package substrate 30 and the lid body 40. A metal bonding member 56 may be temporarily secured to one of the package substrate 30 and the lid body 40 in advance. Alternatively, the metal bonding member 56 may be placed on the package substrate 30 by means of the lid body transportation unit 68 before the lid body 40 is transported.

Figure 3:
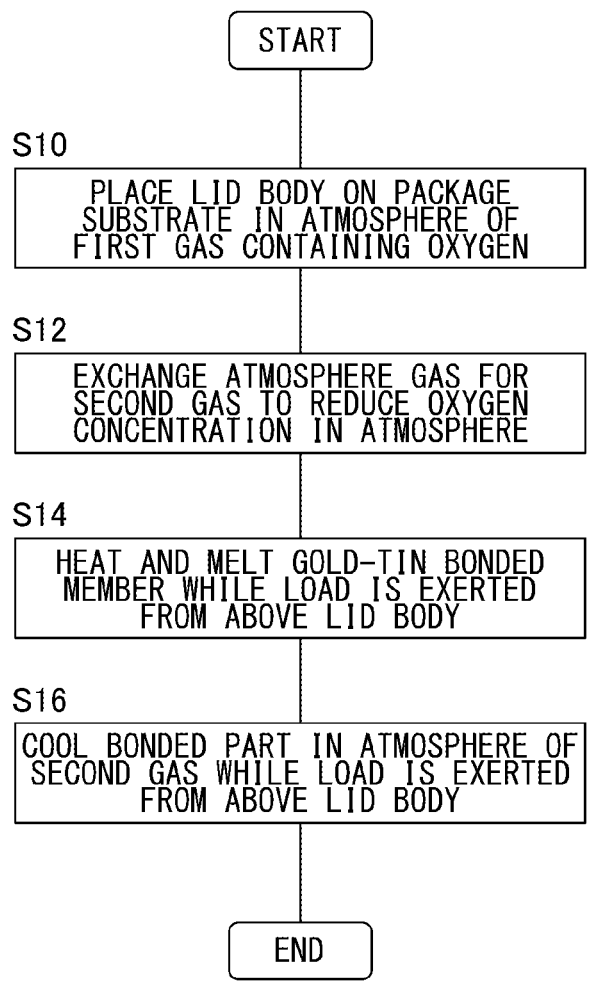
FIG. 3 is a flowchart showing a method of manufacturing the optical semiconductor apparatus.

FIG. 3 is a flowchart showing a method of manufacturing the optical semiconductor apparatus 10 according to the embodiment. First, the lid body 40 is placed on the package substrate 30 in which the optical semiconductor device 20 is housed in the atmosphere of the first gas containing oxygen (S10). The oxygen concentration in the first gas is 10 volume % or higher. Preferably, the oxygen concentration is 20 volume % or higher. The first gas may be a dry air containing nitrogen ($N_2$) and oxygen. In this process, the gold-tin metal bonding member 56 is ensured to be sandwiched between the top surface 31 of the package substrate 30 and the inner surface of the lid body 40. For example, the metal bonding member 56 is a preform of a frame shape associated with the frame-shaped first metal layer 51. The metal bonding member 56 may be attached to the first metal layer 51 of the package substrate 30 in advance. Alternatively, the metal bonding member 56 may be attached to the second metal layer 52 of the lid body 40.

Subsequently, the atmosphere gas is exchanged for the second gas while the lid body 40 is being placed on the package substrate 30 so as to reduce the oxygen concentration in the atmosphere (S12). The second gas is an inert gas that does not substantially contain oxygen. For example, the second gas is a pure nitrogen gas. The oxygen concentration in the second gas is 0.01 volume % or lower. Preferably, the oxygen concentration is 0.005 volume % or lower. By exchanging the atmosphere gas for the second gas that does not substantially contain oxygen, the oxygen concentration in the atmosphere outside the package substrate 30 is reduced. In this process, it is preferable to temporarily seal a space between the package substrate 30 and the lid body 40 by exerting a load from the above lid body 40 to inhibit the oxygen inside the package substrate 30 from leaking outside to lower the oxygen concentration in the package substrate 30. Temporary sealing does not completely seal the package but increases the airtightness inside the package substrate 30 by reducing the gap between the package substrate 30 and the lid body 40.

Subsequently, after the step of exchanging the atmosphere gas for the second gas is started, the gold-tin bonding member 56 is heated and melted while a load is exerted from the above the lid body 40 (S14). This forms gold-tin eutectic bonding between the first metal layer 51 of the package substrate 30 and the second metal layer 52 of the lid body 40. In regard to the timing of heating the gold-tin bonding member, it is desirable to heat the gold-tin bonding member in parallel with the step of exchanging for the second gas instead of waiting until the atmosphere gas is completed exchanged for the second gas. More specifically, it is preferable to heat and melt the bonding member when the oxygen concentration inside the package substrate 30 is 1 volume % or higher, and, preferably, 3 volume % or higher, and when the oxygen concentration outside the package substrate 30 is 0.1 volume % or lower, and, preferably, 0.04 volume % or lower. By performing heating and melting in the condition as described above, it is ensured that oxygen of 1 volume % or higher is contained inside the package substrate 30 and, at the same time, gold-tin is heated and melted in an atmosphere of an oxygen concentration of 0.1 volume % or lower.

Subsequently, the metal bonding part 53 is cooled in the atmosphere of the second gas while the load is being exerted from above the lid body 40 (S16). By placing the heated and melted metal bonding member 56 in the atmosphere of the second gas that does not substantially contain oxygen until the metal bonding member 56 is cooled and solidified, oxidation of the metal bonding part 53 is prevented and a highly reliable eutectic bonding part is formed. This completes the optical semiconductor apparatus 10 shown in FIG. 1.

Figure 4:
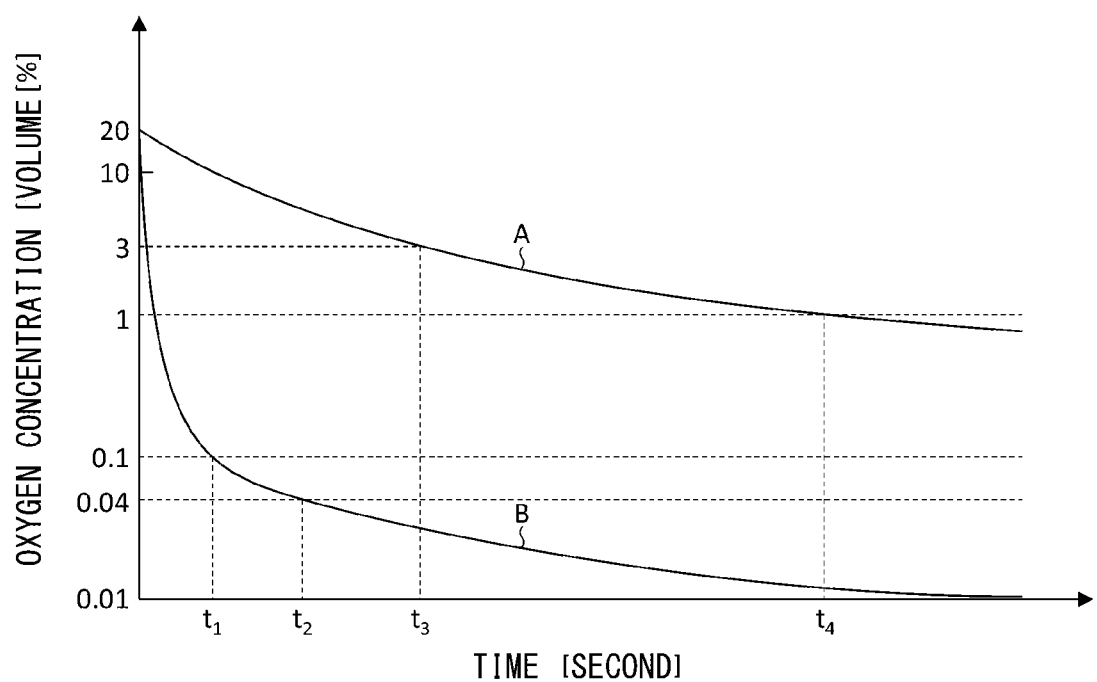
FIG. 4 is a graph schematically showing variation in the oxygen concentration inside and outside the package when the atmosphere gas is exchanged.

FIG. 4 is a graph schematically showing variation in the oxygen concentration inside and outside the package when the atmosphere gas is exchanged. A curve A in the graph shows variation in the oxygen concentration inside the package substrate 30, and a curve B in the graph shows variation in the oxygen concentration outside the package substrate 30. In the example shown in the graph, the oxygen concentration in the first gas is 20 volume %, and the oxygen concentration in the second gas is 0.005 volume %. The graph shows time elapsed since the exchange for the second gas is started, and the oxygen concentration in the vertical axis [volume %] is defined on a logarithmic scale. As indicated by the curve B, the oxygen concentration outside the package substrate 30 drops rapidly due to the introduction of the second gas that does not substantially contain oxygen. For example, the oxygen concentration in the atmosphere outside the package is 0.1 volume % at time $t_1$ and 0.04 volume % at time $t_2$. Meanwhile, the oxygen concentration inside the package substrate 30 drops more slowly than the oxygen concentration outside the package substrate 30. For example, the oxygen concentration inside the package becomes 3 volume % at time $t_3$ after time $t_2$ and becomes 1 volume % at time $t_4$.

The graph shows that gold-tin bonding can be performed in a condition in which the oxygen concentration outside the package is 0.1 volume % or lower and the oxygen concentration inside the package is 1 volume % or higher, by heating and melting the metal bonding member 56 between time $t_1$ and $t_4$ after the exchange for the second gas is started. Further by heating and melting the metal bonding member 56 between time $t_2$ and $t_3$, gold-tin bonding can be performed in a suitable condition in which the oxygen concentration outside the package is 0.04 volume % or lower and the oxygen concentration inside the package is 3 volume % or higher. Variation in the oxygen concentration inside and outside the package depends on the volume of the chamber 62, the flow rate of the second gas, the level of temporary sealing between the package substrate 30 and the lid body 40, etc. In one embodiment, time $t_1$ is after 1-5 seconds, time $t_2$ is after 5-10 seconds, time $t_3$ is after 10-15 seconds, and time $t_4$ is after 20-30 seconds. Accordingly, the metal bonding part 53 is formed in a suitable oxygen concentration condition by heating and melting the metal bonding member 56 after a wait of about 5-15 seconds (e.g., 10 seconds) since the exchange for the second gas is started.

According to the embodiment, oxidation of at least the metal bonding member 56 located at the outer circumference of the package is prevented when the metal bonding member 56 is heated and melted. Accordingly, the quality of bonding at the outer circumference of the package is improved. This improves the reliability of the sealing structure 50. Further, oxygen remains inside the package in a certain amount of larger so that degradation of the semiconductor stack structure 22 due to a low oxygen concentration is suitably prevented. This extends the life of the optical semiconductor device 20 and improves the reliability of the optical semiconductor apparatus 10.

Described above is an explanation based on an exemplary embodiment. The embodiment is intended to be illustrative only and it will be understood by those skilled in the art that various design changes are possible and various modifications are possible and that such modifications are also within the scope of the present invention.

The embodiment and the variation described above have shown the case of including only the optical semiconductor device in the package of the optical semiconductor apparatus. In a further variation, electronic components other than the optical semiconductor device may be built in the package to provide additional functions. For example, a Zener diode for protecting the optical semiconductor device from an electric surge may be built in the housing. A fluorescent body for converting the wavelength of the light output by the optical semiconductor device may be built in. Still alternatively, an optical device for controlling the orientation of the light emitted by the optical semiconductor device may be built in.

The embodiment and the variation described above have shown the optical semiconductor apparatus in which a light emitting device is sealed in the package. In a further variation, the sealing structure described above may be used to seal a light receiving device. For example, the package structure described above may be used to seal a light receiving device for receiving deep ultraviolet light. In essence, the package described above may be used to seal an optical semiconductor device.

The embodiment and the variation described above have shown the case of using a high temperature co-fired ceramic (HTCC) multilayer substrate as a material of the substrate. In a further variation, the ceramic material used may be a low temperature co-fired ceramic (LTCC) multilayer substrate containing silica ($SiO_2$), calcium oxide (CaO), boron oxide ($B_2O_3$), etc. In this case, the electrode or the metal layer may be formed on the substrate by using a metal material having a relatively low melting point such as copper (Cu) and silver (Ag) in place of a high melting point material such as tungsten and molybdenum and forming a multilayer film of Ni/Au on the base member.

It should be understood that the invention is not limited to the above-described embodiment but may be modified into various forms on the basis of the spirit of the invention. Additionally, the modifications are included in the scope of the invention.

What is claimed is:

1. A method of manufacturing an optical semiconductor apparatus comprising:
    placing a light transmissive lid body on a package substrate adapted to house an optical semiconductor device in an atmosphere of a first gas containing oxygen ($O_2$), sandwiching a bonding member containing gold-tin (AuSn);
    exchanging an atmosphere gas for a second gas so as to reduce an oxygen concentration in the atmosphere while a load is exerted from above the lid body placed on the package substrate for temporary sealing; and
    heating and melting the bonding member after an exchange for the second gas is started so as to bond the package substrate and the lid body.

2. The method of manufacturing an optical semiconductor apparatus according to claim 1, further comprising:
    cooling a bonding part while maintaining the load exerted from above the lid body bonded on the package substrate in an atmosphere of a second gas.

3. The method of manufacturing an optical semiconductor apparatus according to claim 1, wherein
    an oxygen ($O_2$) content percentage in the first gas is 10 volume % or higher, and an oxygen ($O_2$) content percentage in the second gas is 0.01 volume % or lower.

4. The method of manufacturing an optical semiconductor apparatus according to claim 1, wherein
    the bonding member starts to be heated and melted before an oxygen concentration inside the package substrate drops to 1 volume % or lower.

5. The method of manufacturing an optical semiconductor apparatus according to claim 1, wherein
    the bonding member starts to be heated and melted after an oxygen concentration outside the package substrate drops to 0.1 volume % or lower.

* * * * *